(12) United States Patent
Zehnich

(10) Patent No.: US 6,605,833 B2
(45) Date of Patent: Aug. 12, 2003

(54) INTEGRATED CIRCUIT WITH CIRCUIT ELEMENTS HAVING DIFFERENT SUPPLY VOLTAGES

(75) Inventor: Paul Zehnich, Altrip (DE)

(73) Assignee: Dialog Semiconductor GmbH, Heidelberg (DE)

( * ) Notice: Subject to any disclaimer, the term of this patent is extended or adjusted under 35 U.S.C. 154(b) by 0 days.

(21) Appl. No.: 09/975,617

(22) Filed: Oct. 11, 2001

(65) Prior Publication Data
US 2002/0043670 A1 Apr. 18, 2002

(30) Foreign Application Priority Data
Oct. 12, 2000 (DE) .......................... 100 50 561

(51) Int. Cl.$^7$ .............................................. H01L 27/10
(52) U.S. Cl. .................. 257/207; 257/204; 257/205; 257/207; 257/208; 257/211; 257/401; 257/758; 363/17; 327/538; 327/540; 323/313; 323/316
(58) Field of Search ................. 257/207, 208, 257/204, 205, 211, 758, 401; 363/97; 327/538, 540–541, 543–544; 323/313, 316

(56) References Cited

U.S. PATENT DOCUMENTS

| | | | | |
|---|---|---|---|---|
| 4,309,627 A | * | 1/1982 | Tabata | 327/81 |
| 4,672,246 A | * | 6/1987 | Donovan | 307/571 |
| 5,057,774 A | * | 10/1991 | Verhelst et al. | 324/537 |
| 5,083,043 A | * | 1/1992 | Yoshida | 327/437 |
| 5,194,762 A | * | 3/1993 | Hara et al. | 327/537 |
| 5,815,040 A | * | 9/1998 | Barbetta | 330/264 |
| 6,097,632 A | * | 8/2000 | Roohparvar | 365/185.19 |
| 6,160,440 A | * | 12/2000 | Javanifard et al. | 327/536 |
| 6,304,131 B1 | * | 10/2001 | Huggins et al. | 365/185.19 |
| 6,501,303 B1 | * | 12/2002 | Suyama | 327/81 |
| 6,512,398 B1 | * | 1/2003 | Sonoyama et al. | 327/58 |

* cited by examiner

Primary Examiner—Stephen D. Meier
Assistant Examiner—Ida M. Soward
(74) Attorney, Agent, or Firm—Henry M. Feiereisen

(57) ABSTRACT

An integrated circuit includes first circuit elements with a supply voltage which is equal to the external supply voltage of the IC, and second circuit elements with a supply voltage which is smaller than the external supply voltage and is derived as an internal supply voltage from the first supply voltage. An active voltage divider supplies the internal supply voltage and includes a first resistance voltage divider connected between the supply voltage terminal and the reference potential, an impedance transformer connected after the first resistance voltage divider, and a circuit for controlling the scaled voltage at the tap of the first resistance voltage divider as a function of the load of the second circuit elements.

3 Claims, 1 Drawing Sheet

INTEGRATED CIRCUIT WITH CIRCUIT ELEMENTS HAVING DIFFERENT SUPPLY VOLTAGES

CROSS-REFERENCES TO RELATED APPLICATIONS

This application claims the priority of German Patent Application Serial No. 100 50 561.9, filed Oct. 12, 2000, the subject matter of which is incorporated herein by reference.

BACKGROUND OF THE INVENTION

The present invention relates, in general, to an integrated circuit (IC), and more particularly to an integrate circuit of a type having first circuit elements with a supply voltage which is equal to an external supply voltage of the IC, and with second circuit elements with a supply voltage which is smaller than the external supply voltage and is derived in form of an internal supply voltage from the first supply voltage.

Integrated circuits of this type are generally known. Those circuit elements are referred to above as first circuit elements are typically large structures that are arranged along the periphery of the IC and derive their power from an external power supply of typically 5 V. Those circuit elements referred to above as second circuit elements are primarily logic circuits with a high signal processing speed. To reduce electrical losses, the second circuit elements typically operate at a lower internal supply voltage of, for example, 3 V. The lower internal supply voltage is produced by a regulated voltage supply that is concealed from the outside. The regulator can include a voltage reference element, for example a Zener diode or a structure with an otherwise fixed band gap, a negatively coupled compensated feedback amplifier, and external support capacitors. Regulators of this type tend to be complex and experience a delay in activating the internal supply voltage after the external supply voltage is switched on. This delay is mainly caused by the external support capacitors.

It would therefore be desirable and advantageous to provide an improved integrated circuit which obviates prior art shortcomings and which is simple in structure and yet does not require additional external components and is able to supply internal power without noticeable delay after the external supply voltage is switched on.

SUMMARY OF THE INVENTION

According to one aspect of the present invention, an integrated circuit (IC) is proposed which includes first circuit elements, whose supply voltage is equal to the external supply voltage of the IC, and second circuit elements whose supply voltage is smaller than the external supply voltage and derived as an internal supply voltage from the first supply voltage. More particularly, the IC includes a first resistance voltage divider connected between the supply voltage terminal and the reference potential, an impedance transformer connected after the first resistance voltage divider, and a circuit for controlling the scalable voltage at the tap of the first resistance voltage divider as a function of the load.

It has been recognized that an integrated regulator for deriving the internal supply voltage can be omitted, because the external supply voltage is typically already stabilized to better than approximately +/−10%. It is therefore sufficient to derive the internal supply voltage from the external supply voltage and to keep the internal supply voltage constant within the stabilization limits of the external supply voltage and independent of the load.

According to one embodiment, the impedance transformer can be implemented as a drain-source channel of a first MOSFET connected between the supply voltage tap and an internal supply voltage terminal of the second circuit elements, with the gate of the MOSFET being connected to the tap of the first resistance voltage divider.

According to another embodiment, the circuit for load-dependent regulation of the partial voltage at the tap of the first resistance voltage divider can be a drain-source channel of a second MOSFET connected between the supply voltage tap and the internal supply voltage terminal, with the gate of the second MOSFET being connected to a tap of a second resistance voltage divider located between the supply voltage tap and the reference potential. A third MOSFET is connected in the drain line of the second MOSFET, which in conjunction with a fourth MOSFET connected between the supply voltage tap and the tap on the first resistance voltage divider forms a current mirror circuit.

BRIEF DESCRIPTION OF THE DRAWING

Other features and advantages of the present invention will be more readily apparent upon reading the following description of a preferred exemplified embodiment of the invention with reference to the accompanying drawing, in which the sole

DETAILED DESCRIPTION OF PREFERRED EMBODIMENTS

Figure 1:
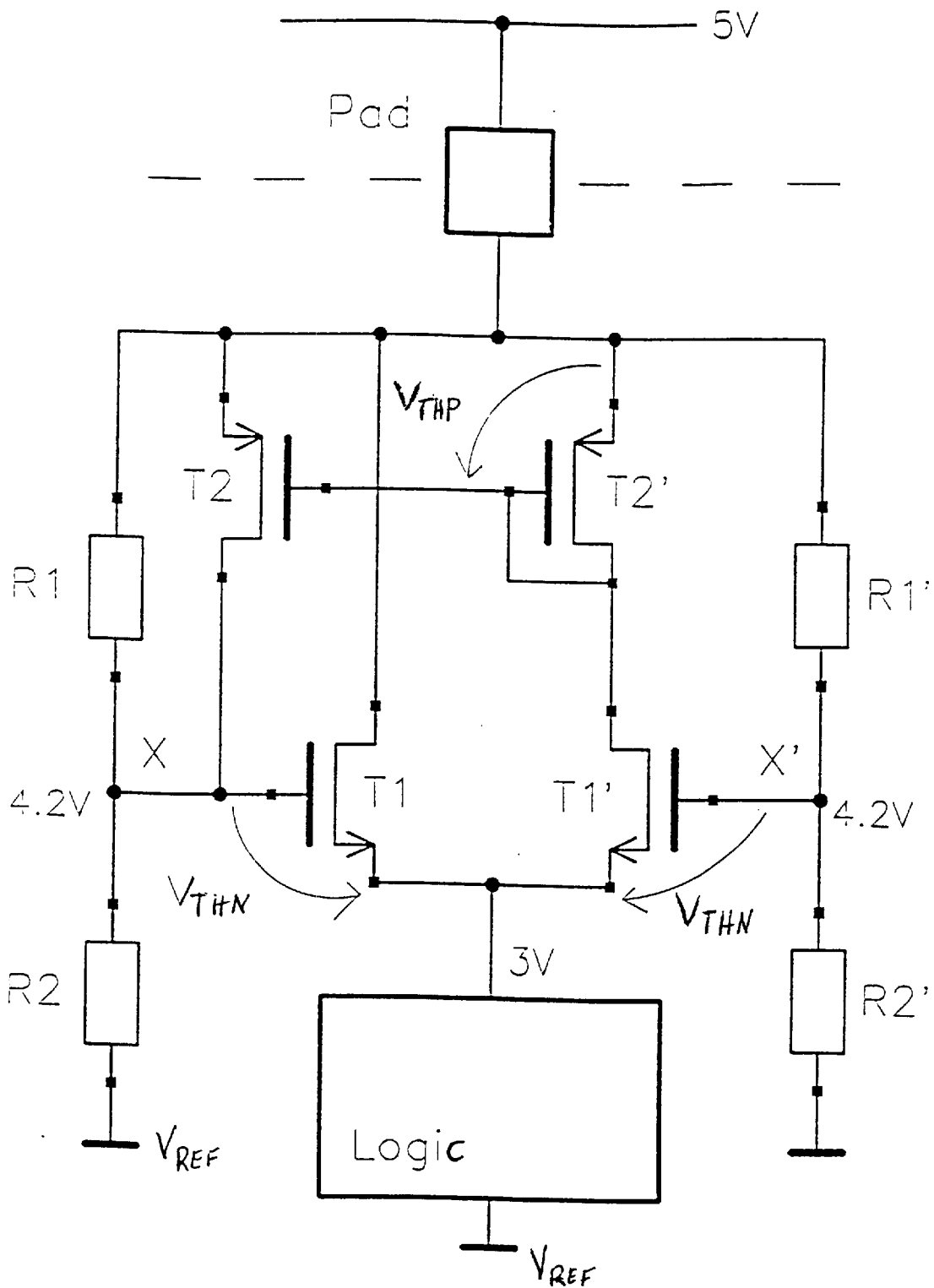
FIG. 1 shows a simplified circuit diagram of an integrated circuit according to the present invention, used to obtain an internal supply voltage.

Referring now to FIG. 1, there is shown an integrated circuit which is connected to an external supply voltage of typically +5 V with respect to a reference potential $V_{REF}$, for example Ground. The supply voltage is applied at a terminal (Pad). First circuit elements (non-shown) are powered by a supply voltage equal to the external supply voltage. The integrated circuit also includes second circuit elements schematically depicted by the block labeled "Logic". The second circuit elements are powered by a lower internal supply voltage of, for example, +3 V to attain a higher signal processing speed and to reduce losses.

The internal supply voltage is obtained using the circuit depicted in FIG. 1. The circuit includes a first resistance voltage divider formed by resistors R1 and R2, which are connected between the supply terminal (Pad) and the reference potential $V_{REF}$. The tap X of the first resistance voltage divider R1 is connected to the gate of a first MOSFET structure T1, with the drain/source channel being connected between Pad and the supply voltage terminal of the second circuit elements labeled "Logic". The MOSFET T1 operates here as an impedance transformer. For an internal supply voltage of 3 V and an assumed power consumption of the second circuit elements of, for example, 100 mW, the voltage on tap X is approximately 4.2 V, assuming a gate/source voltage $V_{THN}$ of approximately 1.2 V. The corresponding voltage drop across the drain/source channel is 2 V. The voltage drop across the drain/source channel increases with increasing power consumption of the second circuit elements. The resistors R1 and R2 have values of 8 kΩ and 42 kΩ, respectively.

This change in the voltage drop across the drain/source channel due to the load can be detected by connecting between the supply voltage terminal (Pad) and the internal supply voltage terminal (3 V) the drain/source channel of a second MOSFET structure T1' in series with the source/drain channel of a third MOSFET structure T2'. The gate of the second MOSFET structure T1' is connected to a tap X' of a second resistance voltage divider R1', R2' which is connected between the supply voltage terminal (Pad) and the reference potential $V_{REF}$. Exemplary values for the resistors R1' and R2' are also 8 kΩ and 42 kΩ, respectively. The gate of the third MOSFET structure T2' is connected, on one hand, to the drain terminal of the second MOSFET T1' and, on the other hand, to the gate of a fourth MOSFET structure T2, with the drain/source channel of the fourth MOSFET structure T2 being connected in parallel with the scaling resistor R1 of the first resistance voltage divider R1, R2. The gate/source voltage $V_{THP}$ in the described exemplary embodiment is approximately 0.9 V. The aforedescribed circuit represents a current mirror circuit. The current mirror circuit causes the voltage at the tap X of the first resistance voltage divider R1, R2 to increase, because the resistance of the source/drain channel of the fourth MOSFET T2 decreases when the internal supply voltage decreases with increasing current consumption of the second circuit elements. The opposite situation arises when the power consumption of the second circuit elements decreases.

While the invention has been illustrated and described as embodied in an integrated circuit with circuit elements having different supply voltages, it is not intended to be limited to the details shown since various modifications and structural changes may be made without departing in any way from the spirit of the present invention.

What is claimed as new and desired to be protected by Letters Patent is set forth in the appended claims:

What is claimed is:

1. An integrated circuit (IC) with first circuit elements, whose supply voltage is equal to an external supply voltage of the IC, and with second circuit elements whose supply voltage is smaller than the external supply voltage and derived as an internal supply voltage from the external supply voltage, said integrated circuit comprising an active voltage divider which supplies the internal supply voltage and includes a first resistance voltage divider connected between an external supply voltage terminal and a reference potential and having at a center tab supplying a scaled voltage, an impedance transformer connected to a first center tap of the first resistance voltage divider, and a circuit for regulating the scaled voltage at the first center tap of the first resistance voltage divider as a function of power consumed by the second circuit elements.

2. The circuit of claim 1, wherein the impedance transformer includes a drain/source channel of a first MOSFET connected between the supply voltage terminal and an internal supply voltage terminal of the second circuit elements, wherein the gate of the first MOSFET is connected to the first center tap of the first resistance voltage divider.

3. The circuit of claim 2, wherein the circuit for regulating the scaled voltage at the first center tap as a function of the power consumed by the second circuit elements further comprises a second resistance voltage divider connected between the external supply voltage terminal and the reference potential, a drain/source channel of a second MOSFET and a drain/source channel of a third MOSFET connected in series between the external supply voltage terminal and the internal voltage supply terminal of the second circuit elements, with the gate of the second MOSFET being connected to a second center tap of the second resistance voltage divider, and a third MOSFET disposed in the drain line of the second MOSFET and a fourth MOSFET connected between the external supply voltage terminal and the first center tap of the first resistance voltage divider, said third MOSFET and fourth MOSFET forming a current mirror circuit.

* * * * *